(12) United States Patent
Shinogi et al.

(10) Patent No.: US 6,479,900 B1
(45) Date of Patent: Nov. 12, 2002

(54) SEMICONDUCTOR DEVICE AND METHOD OF MANUFACTURING THE SAME

(75) Inventors: Hiroyuki Shinogi, Gunma (JP); Nobuyuki Takai, Gunma (JP); Ryoji Tokushige, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/468,414

(22) Filed: Dec. 20, 1999

(30) Foreign Application Priority Data

Dec. 22, 1998 (JP) ........................................... 10-364237
Dec. 22, 1998 (JP) ........................................... 10-364238

(51) Int. Cl.[7] ............................................. H01L 23/48
(52) U.S. Cl. ........................ 257/758; 257/773; 257/778; 257/738

(58) Field of Search ................................. 257/758, 773, 257/778, 738

(56) References Cited

U.S. PATENT DOCUMENTS

| | | | | |
|---|---|---|---|---|
| 5,976,710 A | * | 11/1999 | Sachdev et al. | 428/620 |
| 6,103,552 A | * | 8/2000 | Lin | 438/113 |
| 6,111,317 A | * | 8/2000 | Okada et al. | 257/737 |

* cited by examiner

*Primary Examiner*—Steven Loke
*Assistant Examiner*—Donghee Kang
(74) *Attorney, Agent, or Firm*—Fish & Richardson P.C.

(57) ABSTRACT

A dielectric resin layer R covers a wiring layer 7 and a metal post 8 which are made of Cu. The dielectric resin layer is made of shrinkable resin whose film thickness is greatly reduced during thermal setting. This makes it unnecessary to perform a step of grinding the dielectric resin layer to expose a head of the metal post.

22 Claims, 12 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing it, and more particularly to a chip size package and a method for manufacturing it. The chip size package is also referred to as "CSP" which generally means a package having a size equal or slightly larger than the size of a chip. The chip size package intends to realize high density packaging. The present invention is directed to exposure of the head of a metal post to be adopted in the CSP.

2. Related Art

The structures known previously in this technical field are a "BGA" (Ball Grid Array) having a plurality of solder balls arranged in plane; a "fine pitch BGA" in which the ball pitch in BGA is further reduced so that the outer shape of a package has a size approximately equal of the chip size; etc.

In recent years, a "wafer CSP" has been disclosed in "NIKKEI MICRODEVICE" August 1998, pp. 44–71. The wafer CSP is basically a CSP in which wirings and pads in an array are previously formed in a wafer process before a chip is diced. It is expected that this technique integrates the wafer process and package process to reduce the package cost greatly.

The wafer CSP is classified into two types of a sealing resin type and a re-wiring type. The sealing resin type is a structure in which the surface is covered with sealing resin as in a conventional package. Specifically, in the sealing type structure, a metal post is formed so as to project on a wiring layer of the chip surface, and its periphery is sealed by sealing resin.

Generally, if a package is mounted on a printed board, stress produced owing to a difference in a thermal expansion coefficient between the package and printed board is concentrated on the metal post. It is known that as the metal post is longer in the resin sealing type, the stress is dispersed more greatly.

On the other hand, the re-wiring type is a structure in which "re-wiring" is formed so that it is connected to a bonding pad of a semiconductor surface (without using the sealing resin) as shown in FIG. 10. In the re-wiring structure, an Al (aluminum) electrode 52, a wiring layer 53 and an insulating layer 54 are stacked on the surface of a chip 51. A metal post 55 is formed on the wiring layer 53. A solder ball 56 is formed thereon. The wiring layer 53 is used as the re-wiring means for aligning/arranging the solder bump 53 in a prescribed array on the chip 51.

The sealing type of the wafer CSP, in which the metal post lengthened to 100 μm is reinforced by sealing resin, can acquire great reliability. However, the process of forming sealing resin, which must be carried out using molding die in a post-step, is complicate.

On the other hand, the re-winding type has an advantage that its process is comparatively simple and almost all the steps can be carried out in a wafer process. However, it is necessary to relax the above stress to enhance the reliability.

As clearly seen from FIG. 11 in which the wiring layer 53 in FIG. 10 is omitted, an opening with an Al electrode 52 exposed is formed and at least one layer of a barrier metal 58 is formed between the metal post 55 and Al electrode 52. The solder ball 56 is formed on the metal post 55.

In the case of FIG. 20, polyimide resin is applied to cover the metal post entirely, and after having been set or hardened, its upper face is ground to expose the head of the metal post. However, it is very difficult to control this grinding step so that evenness in the soldering nature and height of the solder ball 56 may be deteriorated.

This can be seen more clearly from FIG. 9. In the case that after the metal post is formed, a thick dielectric resin layer is applied to cover the head thereof, if the surface is ground after the resin layer has been set, because of unevenness of the wafer surface and contact face of a grinder, some metal posts have a barrier metal scraped in its head, and some metal posts have a head with the dielectric resin layer being left. In the latter, the head of the metal post cannot be exposed so that the solder ball or solder bump cannot be formed.

SUMMARY OF THE INVENTION

The present invention has been accomplished in order to solve the above problem.

An object of the present invention is to provide a semiconductor device which can provide a sure contact, can be easily manufactured and acquire great reliability.

The first aspect of the present invention solves the above problem by provision of a dielectric layer of thermosetting resin which covers the chip surface inclusive of said wiring layer and is located, in its main surface on the periphery of said metal post, at a lower position than a head of said metal post due to thermal shrinkage occurring during thermal setting.

Generally, thermosetting resin is shrunk owing to its thermal setting. The resin to be adopted in the present invention should have a very high shrinkage rate to reduce its thickness or height greatly. The resin is baked for setting so that the surface thereof can be located at a lower position than the head of the metal post as shown in FIG. 8. Thus, the heads of all the metal posts can be exposed. All the solder balls can be fixed on the metal posts in good contact therewith.

The second aspect of the present invention solves the problem in such a manner that resin which is mainly composed of amic acid which is used as the resin suffering great shrinkage is applied and shrunk.

The amic acid has a very high shrinking rate of 30–50% and shrinks at a low shrinking temperature of 300–500° C. Therefore, by using this amic acid as the dielectric layer, it is possible to cover the chip surface and maintain the contact with the metal post.

The third aspect of the present invention solves the problem by implementing the steps of forming a second dielectric layer of resin suffering thermal shrinkage during thermal setting on the chip surface on which said first dielectric layer, said wiring layer and said metal post are formed; and shrinking said second dielectric layer by heat treatment so that its main surface on the periphery of said metal post is located at a position lower than a head of said metal post; and forming the solder ball on said metal post.

In this configuration, the second dielectric layer is held covering the chip surface and its surface is lowered owing to its thermal shrinkage so that the contact can be made easily and surely with great reliability.

The fourth aspect of the present invention solves the problem by adopting resin of an amic acid of an applying type or a film type.

The fifth aspect of the present invention solves the problem in such a manner that said film is equipped, on its surface, with a sheet of a different material from said dielectric layers, and the sheet is peeled off to expose said metal post.

The present invention has been accomplished in order to solve the above problem.

First, a dielectric layer of thermosetting resin is adopted in which its main surface on the periphery of said metal post can be located at a lower level than a head of said metal so that a barrier layer can be easily formed on the metal post exposed from the dielectric resin layer.

The film thickness and shape of the barrier layer can be provided with high accuracy and good reproducibility, and hence the reliability of the solder ball or solder bump can be improved.

Secondly, the resin suffering a great reduction of the film thickness owing to thermal shrinkage occurring during thermal setting is adopted so that the head of the metal post can be exposed from the resin and a barrier layer can also be formed on the exposed portion.

Thirdly, the metal post is made of Cu so that an oxidation resistant film covering the exposed portion of the metal post prevents oxidation thereof. This also prevents reduction of the mechanical strength which will occurs when soldering is made with copper oxide being left on the surface of the metal post.

Fourthly, the oxidation resistant film is composed of an underlying layer of Ni and an overlying layer of Au so that Ni prevents oxidation of the metal post, and Au improves its contact and prevents oxidation of Ni.

Fifthly, the dielectric resin layer of amic acid is adopted so that its great reduction rate of the film thickness can expose the head of the metal post effectively.

Sixthly, the manufacturing process comprises the steps of:
forming a Cu wiring layer,
forming a metal post on said wiring layer;
covering the chip surface inclusive of the metal post with a dielectric resin layer;
shrinking the dielectric layer by heat treatment to make its main surface on the periphery of said metal post lower than a head of said metal post so that the head of the metal post is exposed;
forming a barrier layer on the exposed metal post; and
forming a solder ball of said metal post.

Seventhly, the dielectric layer is an applying type or film type material which is made of amic acid and can be located lower than the head of the metal post by heat treatment.

Particularly, the film type is pressurized so that the sheet is kept in contact with the head of the metal post. Therefore, by peeling off the sheet after having been set, the head of the metal post can be easily exposed.

DETAILED DESCRIPTION OF THE PREFERRED EMBODIMENTS

An explanation will be given of various embodiments of the present invention.

Figure 9:
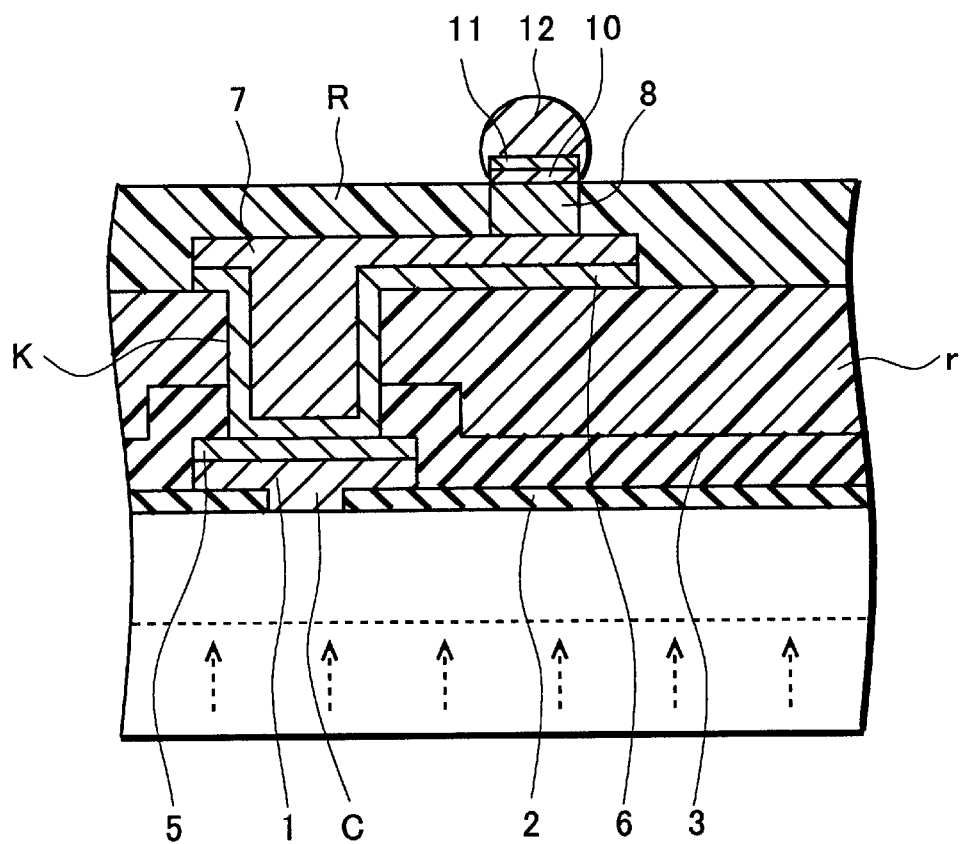
FIG. 9 is a view for explaining the method of manufacturing a semiconductor device according to the first embodiment of the present invention.
Figure 10:
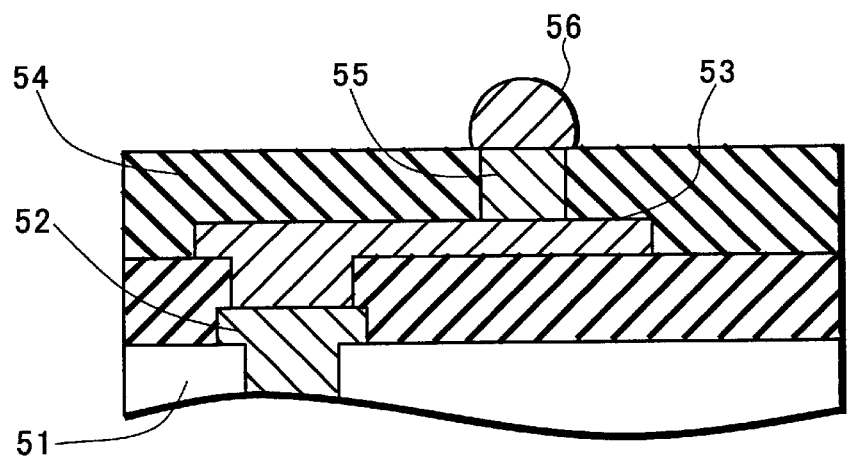
FIG. 10 is a view for explaining a conventional chip size package.
Figure 11:
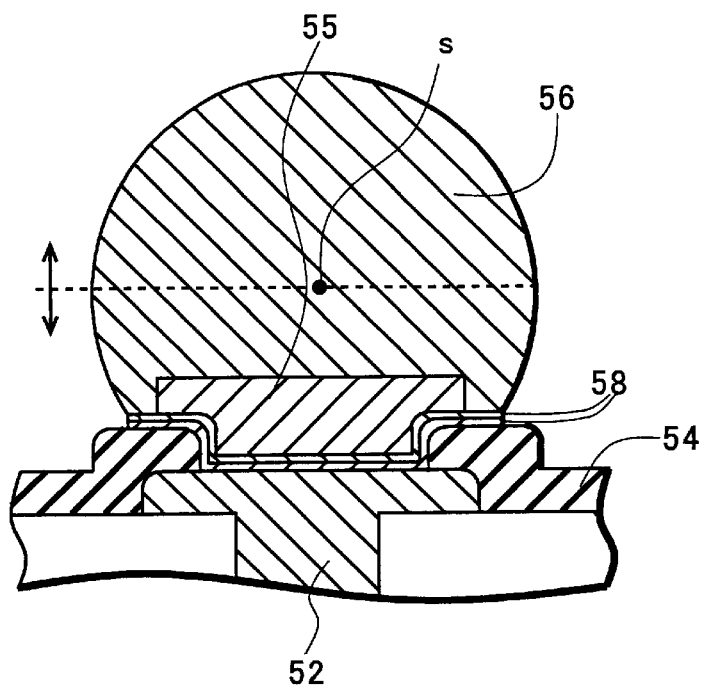
FIG. 11 is a view for explaining a conventional chip size package.

FIG. 9 is a view showing a semiconductor device according to a first embodiment of the present invention. This semiconductor device is characterized in that a dielectric layer covering the chip surface inclusive of a wiring layer 7 is made of an amic acid, and using thermal shrinkage of the dielectric layer, the main surface on the periphery of a metal post 8 is formed to be lower than that of the head of the metal post 8 so that the metal post can be surely connected to the solder ball 12.

In FIG. 9, reference numeral 1 denotes an Al electrode which is an uppermost metal layer (also serving as a bonding pad) in an ordinary wire bonding type IC chip. Reference numeral 2 denotes an interlayer dielectric film in which a contact hole C for the Al electrode 1 is made.

Below the contact hole C, plural metallic layers are formed which are in contact with e.g. a transistor (MOS transistor or BIP transistor), diffused layer, poly-Si gate or poly Si etc.

In this embodiment, although an explanation will be made referring to the MOS transistor, the present invention can be also applied to the BIP transistor.

The structure shown in FIG. 9 can be an IC having a multi-layer wiring structure generally referred to as "single layer metal", "double layer metal", etc.

Reference numeral 3 denotes a passivation film which is made of silicon nitride ($Si_3N_4$), epoxy resin or polyimide resin etc. The passivation film 3 is covered with a dielectric resin layer r for flattening. As described below, this dielectric layer r realizes the flatness to make the height of the solder ball constant. Particularly, where shrinkable resin (film) equipped with a sheet is adopted, when a film before set is pressurized by a plate-shaped pressurizing apparatus, the entire head of the metal post can be brought into contact with the pressurizing portion of the head of the plate-shaped pressurizing apparatus so that the metal can be exposed accurately. The detail thereof will be explained in the explanation of the manufacturing process.

A titanium nitride (TiN) film 5 is formed on the Al electrode 1.

In the passivation film 3 and dielectric resin layer r an opening K is formed which exposes the TiN film 5 formed on the surface of the Al electrode 1. In the opening K, a Cu thin film layer 6 is formed which serves as a plating layer (seed layer) for an wiring layer 7. On the Cu thin film layer 6, the wiring layer 7 is formed by Cu plating.

On the entire chip surface inclusive of the wiring layer 7, a resin layer R is formed. A $Si_3N_4$ film may be formed at an interface between the resin layer R and wiring layer 7 and/or between the resin layer R and metal post 8.

The resin layer R may be thermosetting resin or thermoplastic resin. The thermosetting resin is preferably an amic acid film, polyimide resin, and epoxy resin. The thermoplastic resin is preferably thermoplastic polymer (available as "HIMAL" from HITACHI KASEI LTD). The amic acid film is a resin film having a shrinkage rate of 30–50%.

Now, the resin layer R is prepared using liquid amic acid as a main component material. The liquid amic acid is spun on the entire wafer surface to have a thickness of 20–60 $\mu$m. Thereafter, the resin layer R is polymerized through thermal setting reaction at a temperature more than 300° C. In this case, it should be noted that the resin composed of the amic acid before thermally set is very active in the environment at the above temperature, and hence may react with Cu to deteriorate the interface. However, if the surface of the wiring layer is covered with a $Si_3N_4$ film serving as a barrier layer, reaction of the resin layer with Cu can be prevented. The $Si_3N_4$ film has a thickness of 1000–3000 A.

The $Si_3N_4$ film, which serves as a barrier layer, can be replaced by another dielectric film having a barrier characteristic. However, it should be noted that a $SiO_2$ film has a poor barrier characteristic. Therefore, if the $SiO_2$ film is adopted as the barrier layer, it must be thicker than the $Si_3N_4$ film. The $Si_3N_4$ film, which can be formed by plasma CVD, has an excellent step coverage and hence is preferred. Since coverage of the resin layer R will be made after the metal post has been formed, the provision of the above $Si_3N_4$ layers prevent not only the reaction between the wiring layer 7 of Cu and resin layer mainly composed of the amic acid, but also between the metal post 8 of Cu and the resin layer R mainly composed of the amic acid.

The feature of the present invention resides in the provision of the resin layer R. If this resin layer R is set by the state shown in FIG. 7, it will be set with being shrunk. Thus, the film thickness will be reduced greatly as shown in FIG. 8. As a result, the surface of the resin layer R will be located at a lower position than that of the head of the metal post 8 so that the metal post 8 will be exposed.

This makes it unnecessary to scrape the resin layer R so that its head is exposed. Generally, in order to expose the head of the metal post uniformly by grinding, very difficult control is required. However, in accordance with the present invention, the resin can be shrunk uniformly so that the head of the metal post 8 can be easily exposed.

Accordingly, the head of the metal post 8 appears at the end of the wiring layer 7 so that the Ni layer 10 and Au layer 11 are exposed.

If the solder ball is formed directly on the metal post of Cu, the adhesive strength of the metal post with the solder ball is attenuated because Cu has been oxidized. Further, if the Au layer is directly formed to prevent Cu from being oxidized, Au will be dispersed. In order to obviate such an inconvenience, the Ni layer is interposed between the head of the metal post 8 and the Au layer. Thus, the Ni layer serves to prevent the oxidization of cu and the Au layer serves to prevent the oxidization of the Ni layer. Accordingly, the attenuation(deterioration) of the solder ball and reduction of in adhesive strength between the solder ball and the metal post 8 can be suppressed.

Although the Ni layer and Au layer can be formed by electrolytic plating, they may be formed by non-electrolytic plating.

Finally, the solder ball 12 is formed on the head of the metal post 8.

Now, the solder ball and solder bump will be explained. Generally, the solder ball, which has been prepared as ball-shaped solder separately, is fixed onto the metal post 8. On the other hand, the solder bump is formed generally by electrolytic plating through the wiring layer 7 and the metal post 8. The solder bump may be first formed as a film having a certain thickness and thereafter heat-treated into a ball shape. The solder bump, which has been prepared separately, may be fixed onto the metal post.

Figure 6:
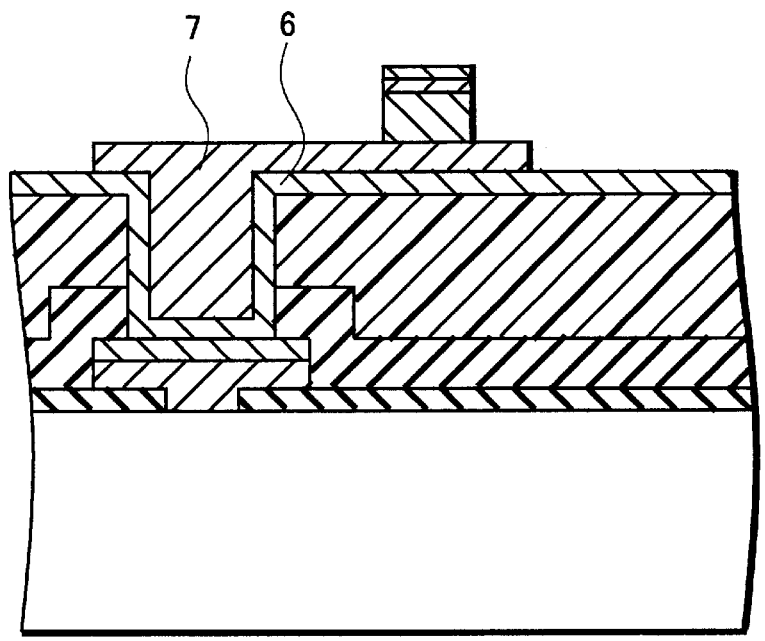
FIG. 6 is a view for explaining the method of manufacturing a semiconductor device according to the first embodiment of the present invention.

Now, since the technique of removing the seed layer 6 in FIG. 6 is used, the electrolytic plating cannot be used, but the solder ball is prepared.

Referring to FIGS. 1–8, an explanation will be given of the process for manufacturing the semiconductor device shown in FIG. 9.

A semiconductor substrate (wafer) in which an LSI with an Al electrode 1 is formed is prepared. It is assumed that the LSI is an IC having a wiring metal in a multi-layer structure inclusive of a first metallic layer, second metallic layer, . . . as described previously. For example, the source electrode and drain electrode of a transistor are formed as the first metallic layer and the Al electrode 1 in contact with the drain electrode is formed as the second metallic layer.

After an opening C from which the drain electrode is exposed is formed in the interlayer dielectric film 2, an electrode material mainly composed of Al and TiN film 5 are formed. Using the resist pattern formed by photolithography as a mask, the Al electrode 1 and TiN film 5 are dry-etched into a prescribed shape.

Instead of the case where a barrier metal is formed in the opening C made after the passivation film 3 has been formed, the electrode inclusive of the TiN film serving as the barrier metal may be patterned by performing the lithography step once. This reduces the number of manufacturing steps.

The TiN film 5 serves as a barrier metal for a thin film layer 6 which will be formed later. In addition, the TiN film is used because it is also effective as an anti-reflection film. Namely, the TiN film is effective to prevent halation of the resist used for patterning. It must have a minimum thickness of 1200 A–1300 A to prevent the halation. In order that the TiN film also serves as the barrier metal, the thickness is preferably 2000 A–3000 A. The thickness exceeding this thickness will give rise to stress owing to the TiN film.

After the Al electrode 1 and TiN film 5 have been patterned, the passivation film 3 was covered over the entire surface. Although an $Si_3N_4$ film was used as the passivation film in this embodiment, it may be an organic film such as an polyimide film (see FIG. 1 until this stage).

Subsequently, a dielectric resin layer r having a thickness of about 3–5 μm was covered over the surface of the passivation film 3. A positive type photosensitive polyimide layer film was used as the dielectric resin layer. Thereafter, an opening K was formed.

Figure 1:
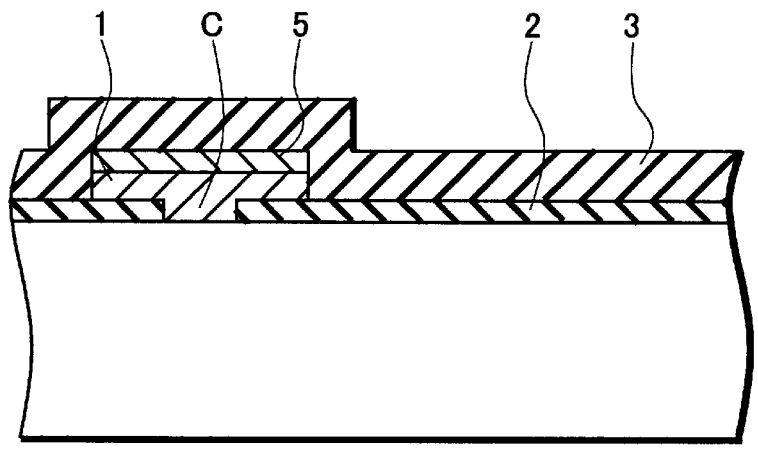
FIG. 1 is a view for explaining the method of manufacturing a semiconductor device according to the first embodiment of the present invention.
Figure 2:
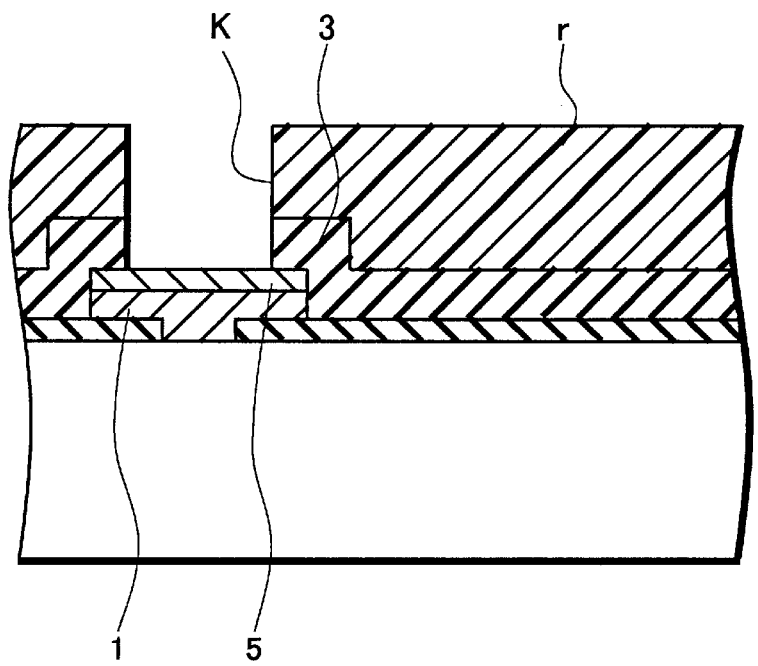
FIG. 2 is a view for explaining the method of manufacturing a semiconductor device according to the first embodiment of the present invention.

Because the photosensitive polyimide film was adopted, pattern exposure can be directly carried out for patterning the opening K in FIG. 2. This makes it unnecessary to perform the steps of making lithography for the photoresist film formed separately and removing after the patterning. It should be noted that the pattern exposure can be implemented through light projection through a metal mask. On the other hand, an non-photosensitive dielectric film pattern can be formed by using the metal mask so that the lithography step can be omitted. It is of course that the metal mask can be used for patterning a photoresist into photoresist pattern as the dielectric film pattern.

The polyimide film is also adopted for flattening. Specifically, in order that the solder ball 12 has a uniform height over the entire region of the semiconductor wafer, the metal post 8 must have a uniform height over the entire region. The wiring layer 7 must be also formed accurately flat. To this end, the polyimide resin is applied, which can flatten the surface since it is fluidic resin having viscosity.

It should be noted that the Al electrode 1 also serves as a pad for external connection of LSI. Therefore, if it is not formed for the chip size package, it can be used as a wire bonding pad (see FIG. 2 until this stage).

Subsequently, a thin film Cu layer 6 was formed on the entire surface. The thin film Cu layer 6, which will be used as a plating electrode for the wiring layer 7, is formed to have a thickness of about 1000–2000 A by sputtering.

Figure 3:
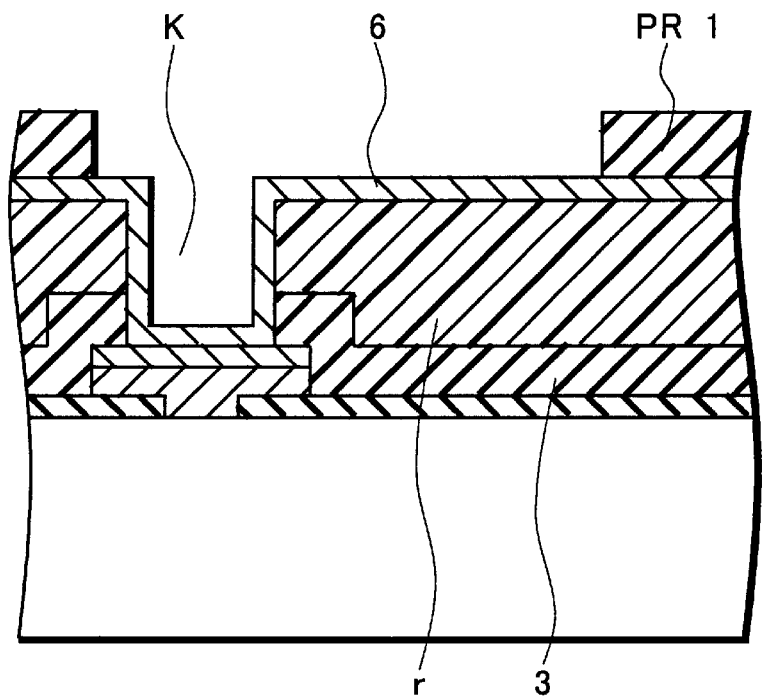
FIG. 3 is a view for explaining the method of manufacturing a semiconductor device according to the first embodiment of the present invention.

Further, a photoresist layer PRI was applied and patterned to remove the portion of the photoresist PRI corresponding to the wiring layer 7 to be patterned (see FIG. 3 until this stage).

The wiring layer 7 was formed using the thin film Cu layer 6 exposed into the opening of the photoresist PRI as a plating electrode. The wiring layer 7 should have a large thickness of 2–5 μm in order to assure the mechanical strength. Although the wiring layer was formed by plating, it may be formed by vacuum deposition or sputtering.

Figure 4:
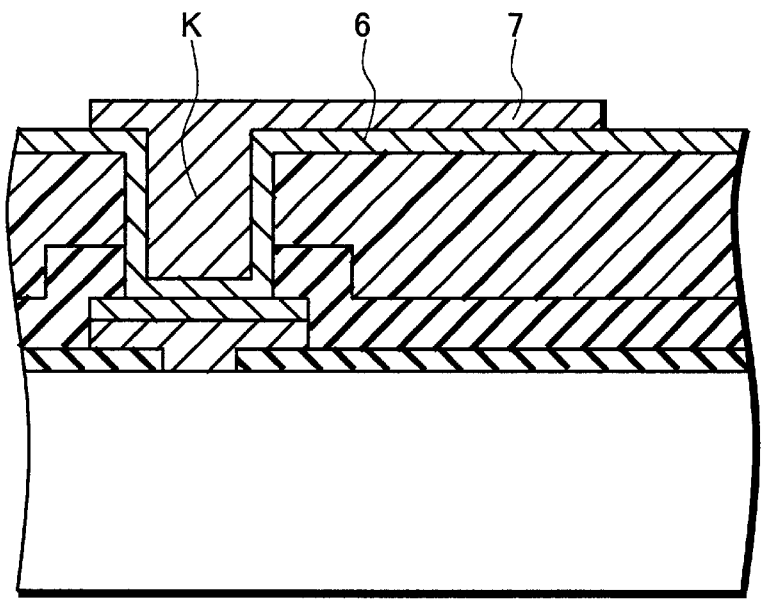
FIG. 4 is a view for explaining the method of manufacturing a semiconductor device according to the first embodiment of the present invention.
Figure 5:
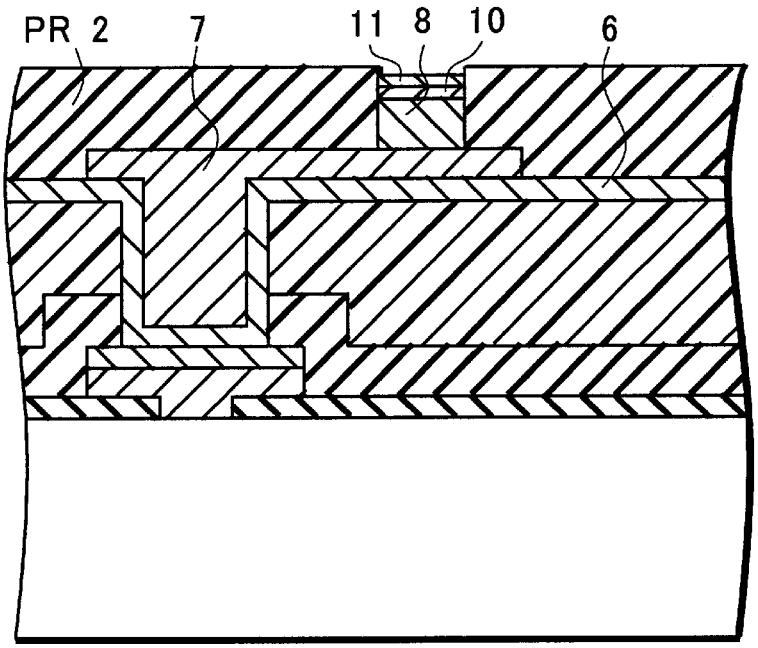
FIG. 5 is a view for explaining the method of manufacturing a semiconductor device according to the first embodiment of the present invention.

Thereafter, the photoresist PRI was removed (see FIG. 4 until this stage).

A photoresist layer PR2 with a region where the metal post 8 is to be formed was formed. A Cu metal post 8 was formed in the exposed region by electrolytic plating. In this case also, the thin film Cu layer 6 was used as the plating electrode.

The metal post 8 was formed to have a height of 30–100 μm. Further, the Ni layer 10 having a thickness of about 1 μm and the Au layer 11 having a thickness of about 5000 A were formed successively by electrolytic plating.

Since the Cu layer (metal post) 8, Ni layer 10 and Au layer were formed successively, they were not exposed to the outside for a long time so that the oxidation of Cu and Ni could be prevented. In this step, Pt or Pd may be used in place of Au (see FIG. 5 until this stage).

Thereafter, the photoresist PR2 was removed, and the thin film Cu layer 6 was removed using the wiring layer 7 as a mask.

Further, although not shown, by plasma CVD, a $Si_3N_4$ film SN may be formed over the entire surface inclusive of the wiring layer 7 and metal post 8.

The provision of the $Si_3N_4$ film intends to prevent the deterioration of an interface. Specifically, Cu is liable to react thermally with the resin before set, which is to be formed in a later step. This deteriorates the interface therebetween. Therefore, it is desired to cover the wiring layer 7 and metal post 8 with the $Si_3N_4$ film. The $Si_3N_4$ film can be omitted where the deterioration of the interface does not occur.

If the $Si_3N_4$ film is formed after the metal post 8 inclusive of the Ni layer 10 and Au layer 11 has been formed, it can cover both wiring layer 7 and metal post 8. The side wall M of the wiring layer 7 and Cu film layer 6 which is exposed by the patterning must be protected. Since both wiring layer 7 and metal post 8 are covered with the $Si_3N_4$ film after they have been patterned, the side wall M can be protected simultaneously.

Figure 7:
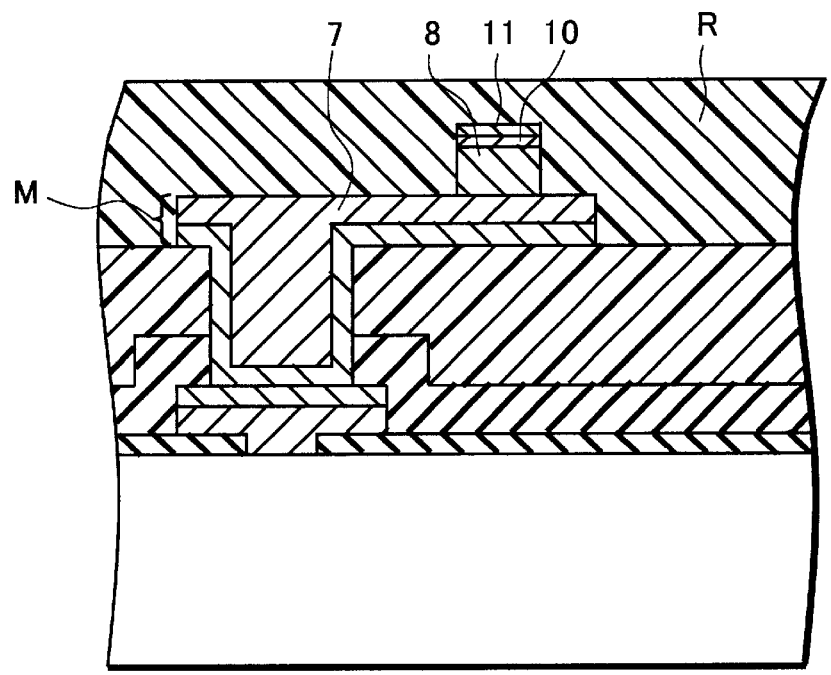
FIG. 7 is a view for explaining the method of manufacturing a semiconductor device according to the first embodiment of the present invention.
Figure 8:
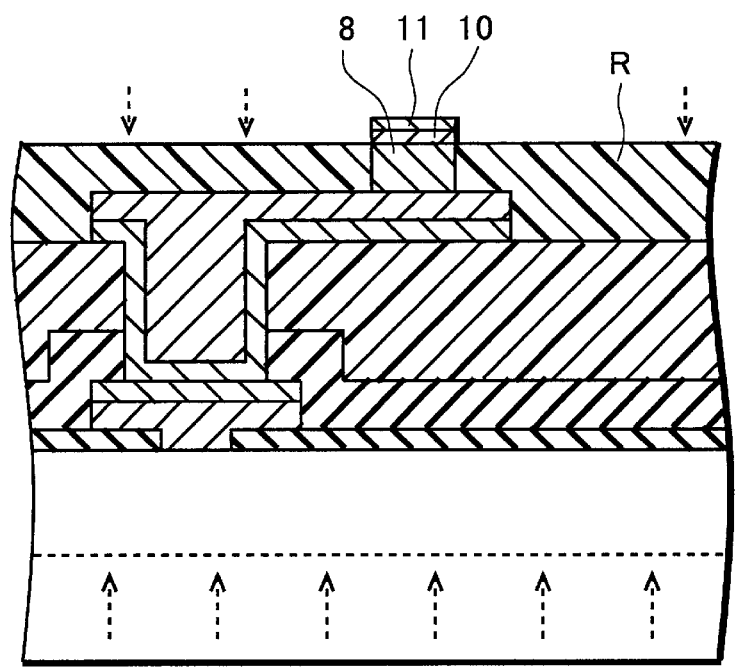
FIG. 8 is a view for explaining the method of manufacturing a semiconductor device according to the first embodiment of the present invention.

A resin layer R was applied to the entire surface (see FIG. 7 until this stage). This resin may be photosensitive resin and will be set by thermal setting reaction.

This photosensitive resin can realize flattening since it has fluidity. Since it is photosensitive, an opening can be made by pattern exposure using the metal mask without using photoresist. This simplifies the manufacturing process.

The dielectric resin layers R and r has the following advantages.

Generally, if the resin having viscosity is applied by a dispenser, even if the air bubbles have been removed, it will take in some air bubbles. If the resin with the air bubbles taken in is sintered, the air bubbles may be ruptured in the later step or owing to using in a high temperature environment by a user.

In this step, the resin was applied by spinning-on and adjustment was made so that the resin is formed to have a thickness of 20–30 μm by performing the spinning-on once. Accordingly, the bubbles having a larger size than the this film thickness will rupture to disappear. The air bubbles having a smaller size than the film thickness will be externally scattered together the resin by centrifugal force of the spinning-on. Thus, the film free from the air bubble can be formed.

The dielectric resin layer R should have a thickness of about 100 μm. To this end, on the basis of the above theory, the resin can be applied at plural times by the spinning-on to form the resin layer while the bubble contained therein is removed.

The resin may be applied by a dispenser but not the spinning-on.

The dielectric resin layer R can provide a feature to the present invention. The feature is that the dielectric resin is shrunk when it is set. Generally, resin will be shrunk to a certain degree after it has been thermally set. However, the pertinent dielectric resin layer R will be shrunk greatly as indicated by arrow after it has been baked. Thus, the surface of the dielectric resin layer R is located at a lower position than the head of the metal post 8. Since the head of the metal post 8 is exposed, the solder ball can be fixed to the head.

In order to increase the strength of the solder ball, the exposure rate must be increased so as to be inclusive of the side wall of the metal post 8. To this end, the exposure rate can be controlled by controlling the amount of the dielectric resin layer R to be applied.

As the case may be, after the dielectric resin layer has been thermally set, a very thin film may be left on the head of the metal post 8. In this case, the head may be simply ground to remove such a very thin film. Since the height of the metal post is uniform over the entire region as described above, each of the heads can be made clean by adopting a grinding plate having flatness.

The dielectric resin layer may be set half so as to have a hardness capable of being ground, ground to the vicinity of the head of the metal post 8 and thereafter set completely. In this case, only the very thin film is left on the head of the metal post 8. Therefore, even if the shrinkage rate of the dielectric resin layer R is small, the metal post can be exposed by the shrinkage of the dielectric resin layer. Since the film thickness which can be arranged on the metal post corresponds to the shrinkage rate of the resin, correspondingly, whether or not the dielectric layer should be ground and the degree of grinding may be determined to expose the metal post (see FIG. 7 until this stage).

In the case that the $Si_3N_4$ film has been formed, the $Si_3N_4$ film on the head of the metal post can be removed by wet etching, dry etching or grinding.

Finally, the solder ball 12 which is prepared separately was aligned and loaded on the metal post and was subjected to re-flowing. The semiconductor substrate was divided into chips along scribing lines in a dicing step to complete the chip size package.

The solder is molten at the timing before the dicing.

After the dielectric resin layer R has been set, a protective sheet is pasted on the entire wafer surface to protect the surface. In this state, a "back-grinding" is carried out.

This is owing to the following reason. In the case that the protective sheet is pasted after the solder ball has been formed, water which flows during the back-grinding will invade the gap formed between the solder ball and protective sheet, and the protective sheet may be peeled off. In addition, the protective sheet, when it is exposed to the high temperature environment, may be cracked along the flaw due to the thermal distortion during the "back-grinding". In order to obviate such an inconvenience, in a possible later step, now, after the thermal treatment for resin setting has been completed, the protective sheet is affixed and the back-grinding is carried out. Therefore, water does not invade, and the crack due to thermal distortion can be also prevented.

In the description hitherto made, although the present invention has been explained in connection with the rewinding type chip size package, the present invention can also be applied to the resin sealing(mould) type chip size package.

In the present invention, a film equipped with a sheet 30 may be adopted as the dielectric resin layer R.

Figure 12:
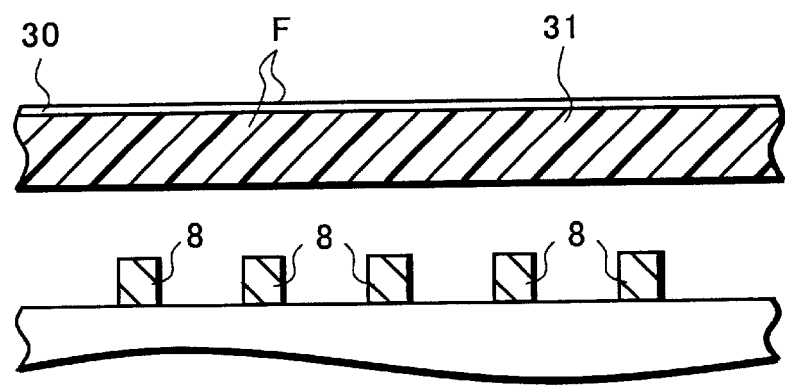
FIG. 12 is a view for explaining a manufacturing method adopting a dielectric resin film equipped with a sheet.

An explanation will be given for this. FIG. 12 shows the manner in which the metal posts are arranged over the entire wafer surface, which corresponds to the structure shown in FIG. 6. As an overlying layer, a dielectric resin layer 31 composed of amic acid is applied to a Teflon sheet 30 to form a film F. In FIG. 12, thick solid line denotes the Teflon sheet 30.

Figure 13:
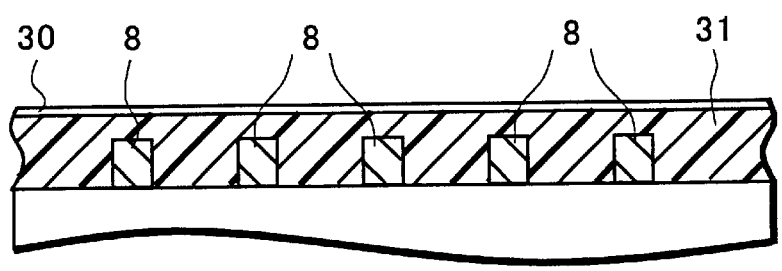
FIG. 13 is a view for explaining a manufacturing method adopting a dielectric resin film equipped with a sheet.

When the film F arranged on the entire wafer surface is pressed in contact with a flat pressing plate from above, the dielectric resin layer 31, which is soft before it is set, can be covered on all the metal posts 8 (seen FIG. 13 until this stage).

The film F is further pressed by the pressing plate. Pressing is ceased when the sheet 30 is brought into contact with the metal post. In this state, the dielectric resin layer 31 is excluded between the head of the metal post and the sheet 30.

In the same manner as in the previous embodiment, the dielectric resin layer 31 is set by heating. Because of the setting, the dielectric resin layer 31 is shrunk so that its surface is located at a lower position than the head of the metal posts 8. This state appears as if the sheet 30 is added to the state shown in FIG. 8 (see FIG. 14 until this stage).

The two following important items must be identified in order to implement this embodiment. The first is that the environment is exhausted to vacuum in the state of FIG. 12. This prevent bubbles from invading when the films are bonded. The second is that pressing by the pressing plate excludes the dielectric resin layer 31 between the sheet 30 and the metal posts 8. Therefore, if the sheet 30 is peeled off after the dielectric resin layer has been thermally set, the head of each metal post 8 can be exposed.

In this case, the thick dielectric resin layer may be left thin on the head of each metal post 8. The resin layer, whose amount is very little, can be easily removed completely by grinding. Because of provision of the dielectric resin layers R and r, the entire surface of the wafer is flat and the height of each of the metal posts 8 is also uniform. Therefore, the head of each of the metal posts 8 over the entire region of the wafer can be cleaned.

If the dielectric resin whose height can be greatly reduced due to its shrinkage in the present invention, the main surface on the periphery of the metal post can be located at a lower position than the head of the metal post. Therefore, the head of the metal post can be exposed so that exposing the head by grinding the dielectric resin layer is not substantially required.

Figure 14:
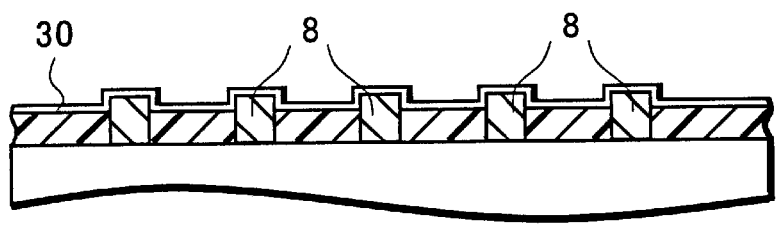
FIGS. 14 and 15 are views for explaining a manufacturing method adopting a dielectric resin film equipped with a sheet.
Figure 15:
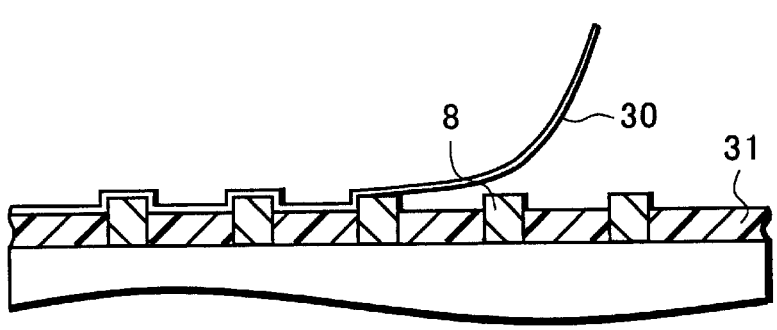

Generally, thermosetting resin is shrunk owing to its setting. The resin to be adopted in the present invention should have a very high shrinkage rate to reduce the thickness or height greatly. The resin is baked for setting so that the surface thereof can be located at a lower position than the head of the metal post as shown in FIGS. 8 and 14. Thus, the heads of all the metal posts can be exposed.

As described above, the sheet of a different material from the dielectric resin layer can be pasted on the surface of the film. By peeling the sheet after the setting, the head of the metal can be exposed. This makes it unnecessary to perform the grinding which requires high accuracy.

The $Si_3N_4$ film may be provided at the interface between the wiring layer and polyimide layer R. This prevents the reaction between the polyimide resin before set and Cu. The metal post and the side wall of the Cu thin film layer can be covered with the $Si_3N_4$ so that the above reaction can be prevented.

Thus, the interfaces between the polyimide resin layer and the Cu wiring layer and between the polyimide resin layer and the Cu thin film layer formed stably with no reaction. This gives anti-moisture and anti-swelling to the chip size package, thereby leading to an improvement in the production yield.

Now referring to FIGS. 16–20, an explanation will be given of the second embodiment of the present invention.

Figure 19:
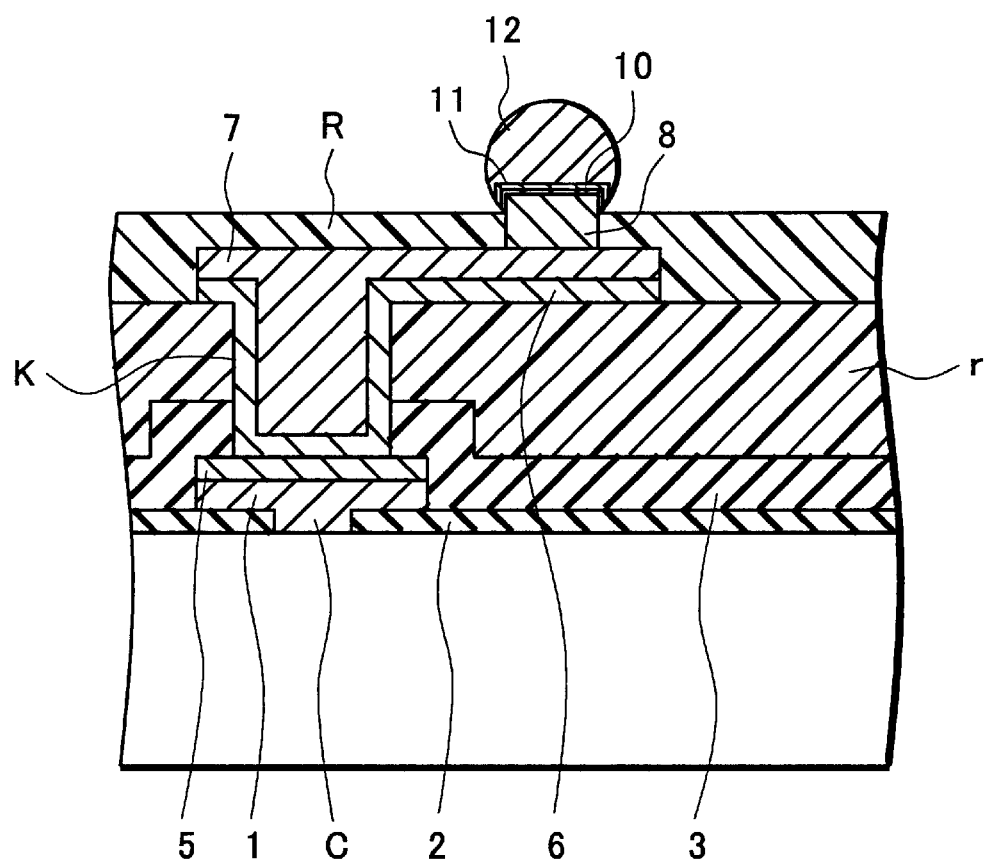
FIG. 19 is a view for explaining the semiconductor device according to the second embodiment of the present invention.
Figure 20:
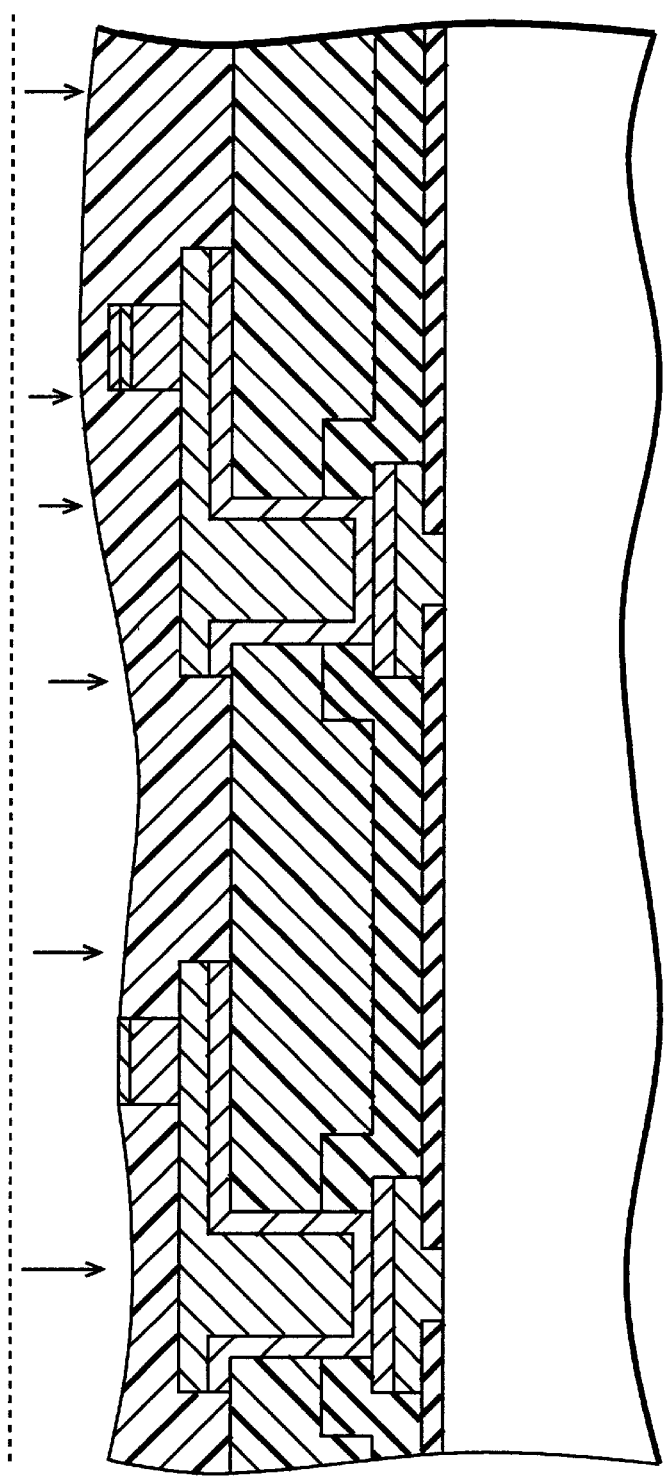
FIG. 20 is a view for explaining the semiconductor device according to the conventional invention.

As shown in FIG. 19, the entire surface of the region of the metal post exposed from the resin layer R is covered with the Ni layer 10 and Au layer 11. The solder ball 12 is formed on the overlying layer. The other elements are formed in entirely the same manner as in the semiconductor device according to the first embodiment as shown in FIG. 9.

Figure 16:
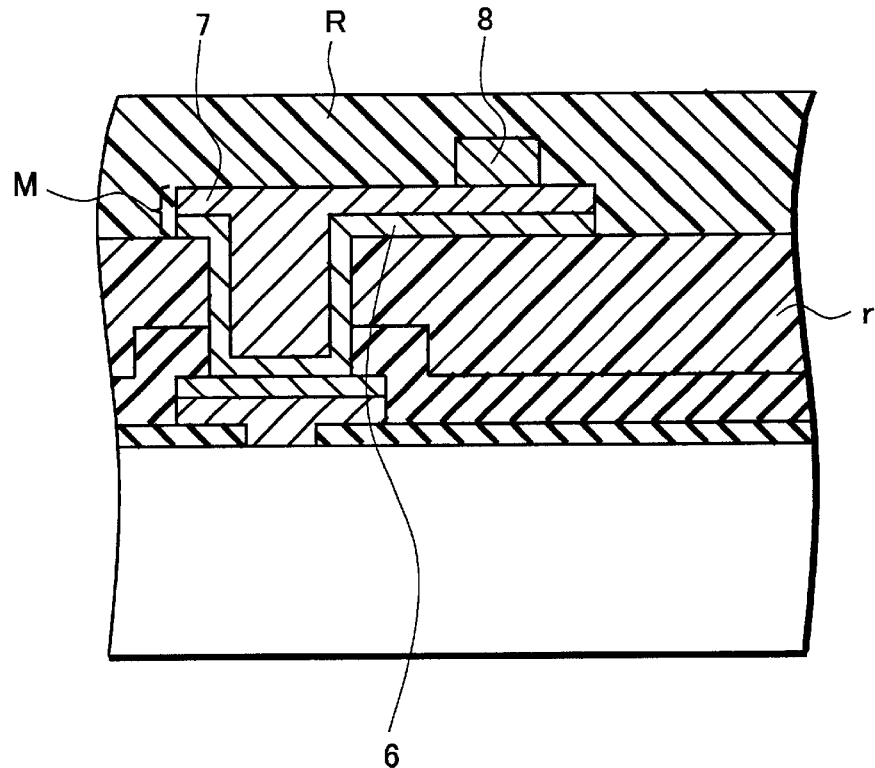
FIG. 16 is a view for explaining the semiconductor device according to the second embodiment of the present invention.

The manufacturing process is the same as that in the first embodiment until the step of forming the wiring layer 7. Thereafter, as shown in FIG. 16, a photoresist is formed with an region where the metal post 8 is to be formed is exposed. The Cu metal post is formed on the exposed region by electrolytic plating. In this case, the Cu thin film layer 6 is used as a plating electrode. The metal post is formed to have a height of 30–40 µm.

Sputtering can be adopted in place of the electrolytic plating.

The photoresist is removed and the Cu thin film layer 6 it removed using the wiring layer 7 as a mask.

Figure 21:
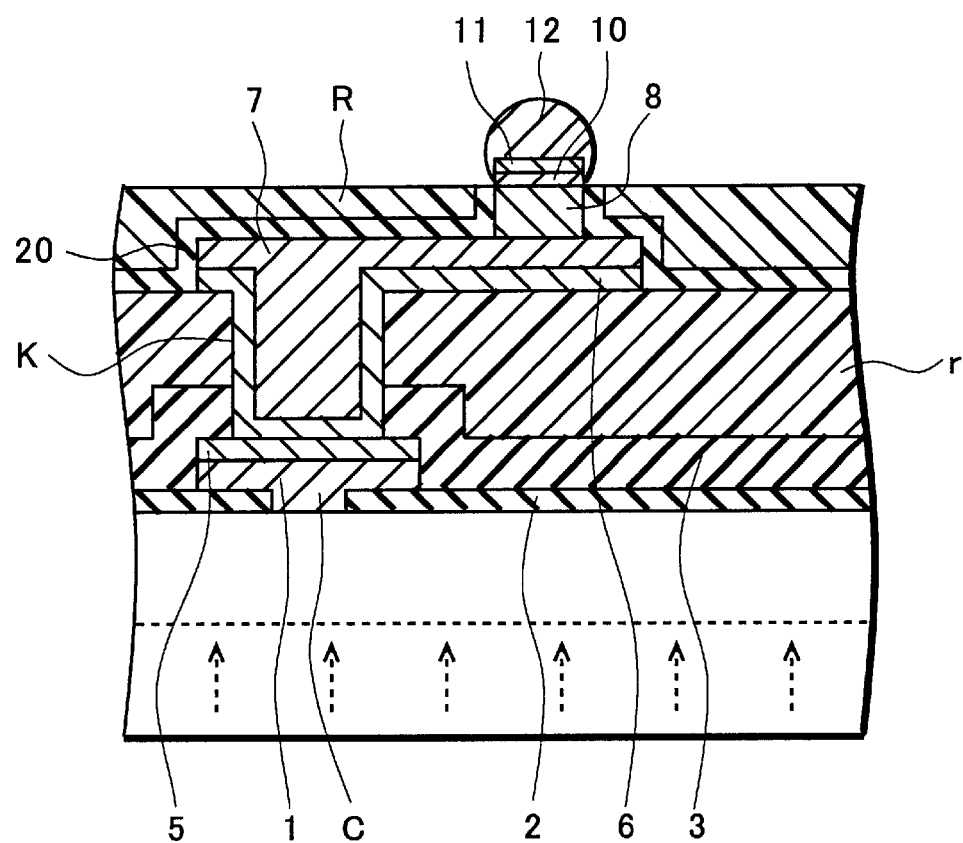
FIG. 21 shows another embodiment according to the present invention.

Further, as shown in FIG. 21, by plasma CVD, a $Si_3N_4$ film 20 may be formed over the entire surface inclusive of the wiring layer 7 and metal post 8.

The provision of the $Si_3N_4$ intends to prevent the deterioration of an interface. Specifically, Cu is liable to react thermally with the resin before set, which is to be formed in a later step. This deteriorates the interface therebetween. Therefore, it is desired to cover the wiring layer 7 and metal post 8 with the $Si_3N_4$ film. The $Si_3N_4$ film can be omitted where the deterioration of the interface does not occur.

If the $Si_3N_4$ film is formed after the metal post 8 has been formed, it can cover both wiring layer 7 and metal post 8. The side wall M which is exposed owing to the patterning must be protected. Since both wiring layer 7 and metal post 8 are covered with the $Si_3N_4$ film after they have been patterned, the side wall M can be protected simultaneously.

Figure 17:
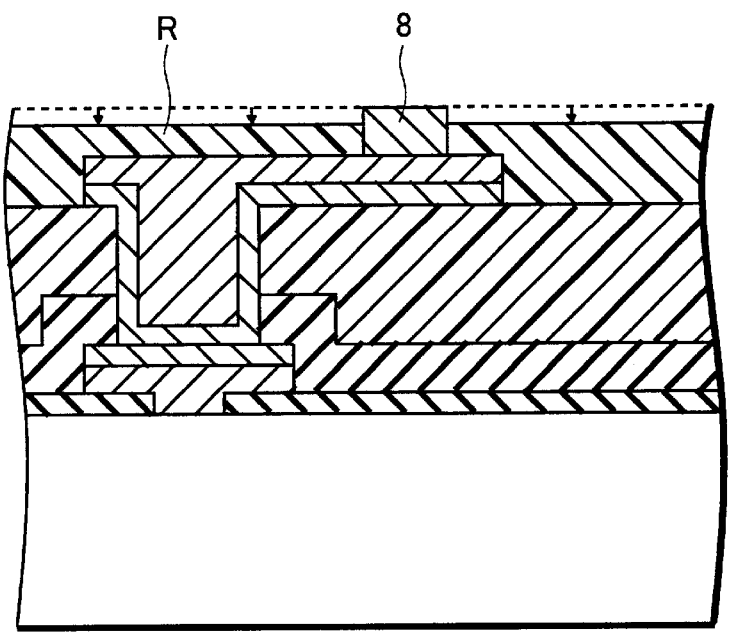
FIG. 17 is a view for explaining the semiconductor device according to the second embodiment of the present invention.

A resin layer R was applied to the entire surface (see FIG. 17 until this stage). This resin may initially have fluidity so that its thickness after thermal setting reaction will be greatly reduced.

This resin can realize flattening before set since it has fluidity. Since its film thickness is reduced, the resin is located at a lower position than the head of the metal post.

The dielectric resin layers R and r has the following advantages.

Generally, if the resin having viscosity is applied by a dispenser, even if the air bubbles have been removed, it will take in some air bubbles. If the resin with the air bubbles taken in is sintered, the air bubbles may be ruptured in the later step or owing to using in a high temperature environment by a user.

In this step, the resin was applied by spinning-on and adjustment was made so that the resin is formed to have a thickness of 20–30 µm by performing the spinning-on once. Accordingly, the bubbles having a larger size than the this film thickness will rupture to disappear. The air bubbles having a smaller size than the film thickness will be externally scattered together the resin by centrifugal force of the spinning-on. Thus, the film free from the air bubble can be formed.

The dielectric resin layer R should have a thickness of about 50 µm. To this end, on the basis of the above theory, the resin can be applied at plural times by the spinning-on to form the resin layer while the bubble contained therein is removed.

The resin may be applied by a dispenser but not the spinning-on.

The dielectric resin layer R can provide a feature to the present invention. The feature is that the dielectric resin is shrunk when it is set. Generally, resin will be shrunk to a certain degree after it has been set. However, the pertinent dielectric resin layer R will be shrunk greatly as indicated by arrow after it has been baked (see FIG. 17). Thus, the surface of the dielectric resin layer R is located at a lower position than the head of the metal post 8. Since the head of the metal post 8 is exposed, the solder ball can be fixed to the head.

In order to increase the strength of the solder ball, the exposure rate must be increased so as to be inclusive of the side wall of the metal post 8. To this end, the exposure rate can be controlled by controlling the amount of the dielectric resin layer R to be applied.

As the case may be, after the dielectric resin layer has been set, a very thin film may be left on the head of the metal post 8. In this case, the head may be simply ground to remove such a very thin film. Since the height of the metal post is uniform over the entire region as described above, each of the heads can be made clean by adopting a grinding plate having flatness.

The dielectric resin layer may be set half so as to have a hardness capable of being ground, ground to the vicinity of the head of the metal post 8 and thereafter set completely. In this case, only the very thin film is left on the head of the metal post 8. Therefore, even if the shrinkage rate of the dielectric resin layer R is small, the metal post can be exposed by the shrinkage of the dielectric resin layer. Since the film thickness which can be arranged on the metal post corresponds to the shrinkage rate of the resin, correspondingly, whether or not the dielectric layer should be ground and the degree of grinding may be determined to expose the metal post (see FIG. 18 until this stage).

Where the $Si_3N_4$ film has been formed, the $Si_3N_4$ film on the head of the metal post can be removed by wet etching, dry etching or grinding.

On the exposed metal post 8, the Ni layer 10 and Au layer 11 are plated successively. Now since the Cu thin film layer 6 has been removed using the wiring layer 7 as a mask, the Ni layer 11 having a thickness of about 1 µm and the Au layer 11 having a thickness of 5000 A are formed by non-electrolytic plating.

This step is the most important step in this embodiment. As described in connection with FIG. 20, if the dielectric resin layer applied to overlie the head of the metal post is ground, it is very difficult to expose the head of the metal post. Further, since the Au layer having a thickness of 5000 A resides as the uppermost layer, if flat grinding is not realized, in a certain metal post, Au may be exposed; in another metal post, Au may be covered with the dielectric resin layer; and in a still another metal post, Au may be cut (removed) away. Thus, since the grinding may oxidize the Ni layer in an exposed part of Ni from Au, the various metal posts where the solder ball can be surely fixed, be weakly fixed or cannot be fixed due to Ni oxidation.

Figure 18:
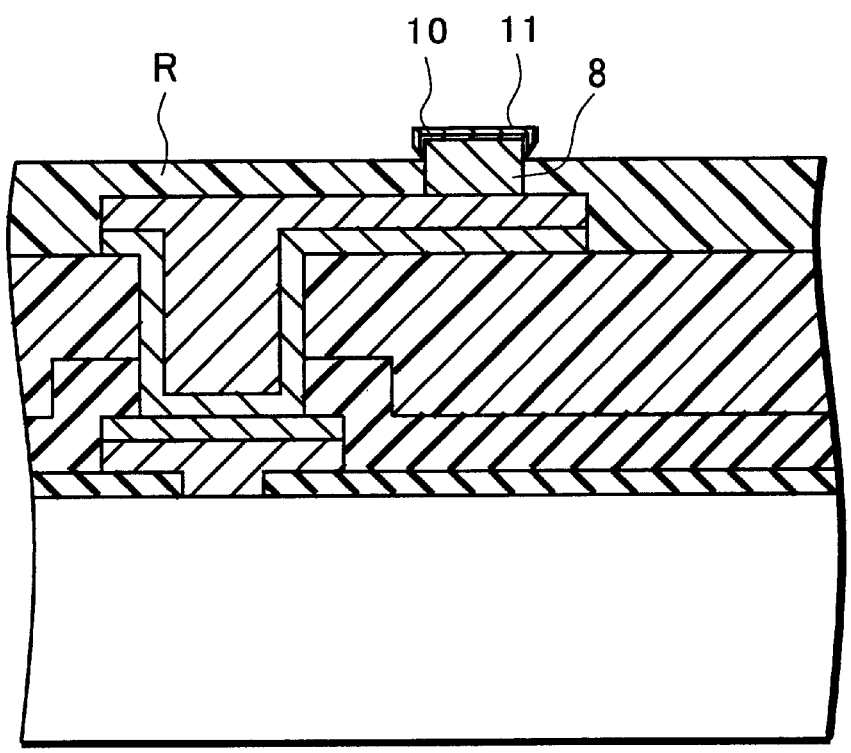
FIG. 18 is a view for explaining the semiconductor device according to the second embodiment of the present invention.

In this embodiment, since the metal post 8 is exposed, the barrier metal layers 10 and 11 can be formed accurately, and the solder ball can be fixed surely (see FIG. 18 until this stage).

Finally, the solder ball 12 which is prepared separately was aligned and loaded on the metal post and was subjected to re-flowing. The semiconductor substrate was divided into chips along scribing lines in a dicing step to complete the chip size package.

The present invention is applicable not only to thermosetting resin but also to thermoplastic resin.

What is claimed is:

1. A semiconductor device comprising:
    a wiring layer coupled to a metallic electrode pad and extended over a chip surface;
    a metal post formed on said wiring layer;
    a dielectric layer of thermosetting resin, formed over the chip surface including said wiring layer and disposed below a head of said metal post to expose the head; said thermosetting resin having a property of contracting 30–50% in a thermal setting step;
    a $Si_3N_4$ film disposed between the dielectric layer and the wiring layer; and
    a solder bump fixed to the head of said metal post.

2. A semiconductor device according to claim 1, wherein said surface of the dielectric layer is leveled-off to be lower than the head of said metal post because of thermal shrinkage of thermosetting resin.

3. A semiconductor device according to claim 1, wherein said dielectric layer is made of resin which shrinks thermally by 30–50% in a thermal setting step.

4. A semiconductor device according to claim 2, wherein said wiring layer is made of Cu.

5. A semiconductor device according to claim 2, wherein said metal post is made of Cu.

6. A semiconductor device according to claim 5, wherein an entire surface of said metal post which is exposed from an interface with said dielectric layer covered with a barrier metal layer.

7. A semiconductor device according to claim 6, wherein said barrier metal layer is formed in a double layer structure composed of Ni and Au layers.

8. A semiconductor device according to claim 2, wherein the head of said metal post is covered with a barrier metal layer.

9. A semiconductor device according to claim 8, wherein said barrier metal is formed in a double layer structure composed of Ni and Au layers.

10. A semiconductor device according to claim 8, wherein said solder bump is prepared in a separate step, and is fixed on a surface of said barrier metal layer by thermal melting.

11. A semiconductor device comprising:
    a wiring layer coupled to a metallic electrode pad and extended over a chip surface;
    a metal post formed on said wiring layer;
    a dielectric layer of amic acid resin formed over the chip surface including the wiring layer, said amic acid resin having a property of contracting 30–50% in a thermal setting step;
    a $Si_3N_4$ film disposed between the dielectic layer and the wiring layer; and
    a solder bump fixed to a head of said metal post;
        wherein the surface of the dielectric layer is lower than a head of said metal post by thermally shrinking the amic acid resin.

12. A semiconductor device comprising:
    a wiring layer coupled to a metallic electrode pad and extended over a chip surface;
    a metal post formed on said wiring layer;
    a dielectric layer of thermo setting resin, formed over the chip surface including said wiring layer and disposed below a head of said metal post to expose the head; said thermo setting resin having a property of contracting 30–50% in a thermal setting step;
    a $Si_3N_4$ film disposed between the dielectric layer and the metal post; and
    a solder bump fixed to the head of said metal post.

13. A semiconductor device according to claim 12, wherein said surface of the dielectric layer is leveled-off to be lower than the head of said metal post because of thermal shrinkage of thermosetting resin.

14. A semiconductor device according to claim 13, wherein said wiring layer is made of Cu.

15. A semiconductor device according to claim 13, wherein said metal post is made of Cu.

16. A semiconductor device according to claim 15, wherein an entire surface of said metal post which is exposed from an interface with said dielectric layer is covered with a barrier metal layer.

17. An semiconductor device according to claim 16, wherein said barrier metal layer is formed in a double layer structure composed of Ni and Au layers.

18. A semiconductor device according to claim wherein said dielectric layer is made of resin which shrinks thermally by 30–50% in a thermal setting step.

19. A semiconductor device according to claim 13, wherein the head of said metal post is covered with a barrier metal layer.

20. A semiconductor device according to claim 19, wherein said barrier metal is formed in a double layer structure composed of Ni and Au layers.

21. A semiconductor device according to claim 17, wherein said solder bump is prepared in a separate step, and is fixed on a surface of said barrier metal layer by thermal melting.

22. A semiconductor device comprising:
    a wiring layer coupled to a metallic electrode pad and extended over a chip surface;
    a metal post formed on said wiring layer;
    a dielectric layer of amic acid resin formed over the chip surface including the wiring layer, said amic acid resin having a property of contracting 30–50% in a thermal setting step;
    a $Si_3N_4$ film disposed between the dielectric layer and the metal post; and
    a solder bump fixed to a head of said metal post;
    wherein the surface of the dielectric layer is lower than a head of said metal post by thermally shrinking the amic acid resin.

* * * * *